(12) United States Patent
Wei

(10) Patent No.: US 11,917,896 B2
(45) Date of Patent: Feb. 27, 2024

(54) FLEXIBLE SUBSTRATE, METHOD OF MANUFACTURING THEREOF, AND DISPLAY PANEL

(71) Applicant: TCL CHINA STAR OPTOELECTRONICS TECHNOLOGY CO., LTD., Guangdong (CN)

(72) Inventor: Hongquan Wei, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 586 days.

(21) Appl. No.: 16/618,932

(22) PCT Filed: Aug. 15, 2019

(86) PCT No.: PCT/CN2019/100768
§ 371 (c)(1),
(2) Date: Jan. 7, 2021

(87) PCT Pub. No.: WO2021/000381
PCT Pub. Date: Jan. 7, 2021

(65) Prior Publication Data
US 2021/0336165 A1  Oct. 28, 2021

(30) Foreign Application Priority Data

Jul. 2, 2019 (CN) .......... 201910589585.8

(51) Int. Cl.
H01L 23/00 (2006.01)
H10K 77/10 (2023.01)
H10K 50/822 (2023.01)
H10K 71/00 (2023.01)

(52) U.S. Cl.
CPC ......... *H10K 77/111* (2023.02); *H10K 50/822* (2023.02); *H10K 71/00* (2023.02)

(58) Field of Classification Search
CPC ..... H01K 77/111; H10K 50/822; H10K 71/00
See application file for complete search history.

(56) References Cited

U.S. PATENT DOCUMENTS

2016/0343969 A1  11/2016  Zeng et al.
2019/0246497 A1  8/2019  Shi et al.

FOREIGN PATENT DOCUMENTS

CN  104538420 A  4/2015
CN  108365094 A  8/2018

*Primary Examiner* — Anthony Ho
(74) *Attorney, Agent, or Firm* — PV IP PC; Wei Te Chung; Zhigang Ma

(57) ABSTRACT

A flexible substrate, a method of manufacturing thereof, and display panel are provided. The flexible substrate includes a glass substrate, a first flexible base layer disposed on the glass substrate, a second flexible base layer disposed on the first flexible base layer, and a third flexible base layer disposed on the second flexible base layer.

3 Claims, 4 Drawing Sheets

---

2,5-bis(4-aminophenylthio)thiophene is used as a diamine, 4,4' bis(3,4 dicarboxyphenylthio)diphenyl sulfide dianhydride is used as a dianhydride, the diamine and the dianhydride are dissolved in a solvent of N-methylpyrrolidone, a molar ration of diamine and the dianhydride is 1:1, and a solid content of a solution comprising the diamine and the dianhydride is controlled by 15%, the solution is coated on a surface of the glass substrate, and a film is formed by polymerizing at 300 °C under a nitrogen atmosphere to obtain a first polyimide layer having a refractive index of 1.75 — S410 a molar ratio of the diamine and the dianhydride in the solvent of N-methylpyrrolidone is adjusted to decrease a molar ratio of 2,5-bis(4-aminophenylthio)thiophene, the flexible substrate having a refractive index less than 1.75 is obtained — S420 a film is sequentially formed to obtain the flexible substrate having a refractive index gradient — S430

```
┌─────────────────────────────────┐
│ 2,5-bis(4-aminophenylthio)thiophene is used as a diamine,          │
│ 4,4'-bis(3,4-dicarboxyphenylthio)diphenyl sulfide dianhydride is    │
│ used as a dianhydride, the diamine and the dianhydride are          │  S410
│ dissolved in a solvent of N-methylpyrrolidone, a molar ratio of     │
│ diamine and the dianhydride is 1:1, and a solid content of the      │
│ diamine and the dianhydride is controlled by 15%, the solution is   │
│ coated on a surface of the glass substrate, and a film is formed    │
│ by polymerizing at 300 °C under a nitrogen atmosphere to obtain     │
│ a first polyimide layer having a refractive index of 1.75           │
└─────────────────────────────────┘
                    ↓
┌─────────────────────────────────┐
│ a molar ratio of the diamine and the dianhydride in the solvent    │
│ of N-methylpyrrolidone is adjusted to decrease a molar ratio of     │  S420
│ 2,5-bis(4-aminophenylthio)thiophene, the flexible substrate         │
│ having a refractive index less than 1.75 is obtained                │
└─────────────────────────────────┘
                    ↓
┌─────────────────────────────────┐
│ a film is sequentially formed to obtain the flexible substrate     │  S430
│ having a refractive index gradient                                  │
└─────────────────────────────────┘
```

FIG. 4

FLEXIBLE SUBSTRATE, METHOD OF MANUFACTURING THEREOF, AND DISPLAY PANEL

BACKGROUND OF INVENTION

Field of Invention

The present invention relates to the field of display, and more particularly, to a flexible substrate, a method of manufacturing thereof, and a display panel.

Description of Prior Art

Flexible displays are thin, flexible, non-fragile, and inexpensive, and thus flexible display technology has received extensive attention from various electronic products, which has made flexible technology to become an important development direction of display technology.

Currently, main technical directions of flexible displays include flexible organic light emitting diode (OLED) displays, flexible liquid crystal (LCD) displays, flexible electrophoretic displays (EPDs), micro liquid emitting display (LED), etc., and material technology and fabrication technology involved in flexible substrates/covers are important. Polyimide (PI) materials in the prior art are main choice for flexible substrates due to their stable chemical resistance, radiation resistance, heat resistance, and good dielectric properties.

Currently, the main technical directions of flexible displays include flexible OLEDs, flexible LCDs, flexible EPDs, micro LEDs, etc., and the material technology and process technology involved in flexible substrates/covers are the key. Polyimide (PI) materials in the prior art are the main choice for flexible substrates due to their stable chemical resistance, radiation resistance, heat resistance and good dielectric properties.

As for the organic light emitting diode device, there are two indicators like internal quantum efficiency pint and the external quantum efficiency $\eta_{ext}$, and generally the two indicators have following relation: $\eta_{ext} = \chi \phi_{int}$.

$\chi$ is the coefficient of the two indicators. As for the organic light emitting diode device, the internal quantum efficiency pint depends on the luminous efficiency of the material itself, while the external quantum efficiency depends on the light emitting efficiency of the entire device, and the $\chi$ depends on the refractive index of each layer. That is, it presents a ratio of the emitted light which is reflected and lost in the device. As for the organic light emitting diode devices, the light emission can be mainly divided into three categories such as direct emission into the air, internal reflection in the substrate, and the light is reflected in the indium tin oxide (ITO)/organic layer. According to the calculation, the ratio of the three modes is 0.19, 0.36, and 0.46, thereby reducing the reflection of light in the ITO/organic layer, which is the key to improving the external quantum efficiency of the organic light emitting diode device.

Generally, a refractive index of the ITO layer 12 is 1.94, a refractive index of the organic layer 11 is 1.74, and a refractive index of the general substrate 13 is 1.52. It is known from reflection law that the difference in refractive index between the two interfaces is larger, the total reflection is more likely to occur. Therefore, we need to properly dispose a multilayer structure to achieve the effect of anti-reflection and enhanced transmission. Currently, a commonly method is used to deposit inorganic or organic materials on the substrate by using chemical vapor deposition (CVD), physical vapor deposition (PVD), or to make microstructures on the substrate. Most of these methods improve the reflection effect in the substrate, and the process is complicated and costly, which easily affects the characteristics of the devices.

SUMMARY OF INVENTION

A new method is provided. It can achieve a highly effective anti-reflection and enhanced transmission effect without requiring a complicated process. When the flexible polyimide (PI) is polymerized to form a film, a ratio of hetero atoms in the polymer is controlled, and the refractive index thereof is also controlled. A multilayer flexible PI substrate having a refractive index gradient can be obtained through the continuous film forming process, such that the flexible substrate itself has a function of reducing reflection.

In order to solve the above technical problems, a flexible substrate is provided. The flexible substrate includes a glass substrate, a first flexible base layer disposed on the glass substrate, a second flexible base layer disposed on the first flexible base layer, and a third flexible base layer disposed on the second flexible base layer.

A purpose of the present invention and solving the technical problems thereof are achieved by the following technical solutions.

In one embodiment, the first flexible base layer is a first polyimide layer, the second flexible base layer is a second polyimide layer, and the third flexible base layer is a third polyimide layer.

In one embodiment, the first flexible base layer has a refractive index greater than 1.52.

In one embodiment, a thickness of the first flexible base layer ranges from 1 μm to 100 μm, and preferably ranges from 1 μm to 10 μm.

In one embodiment, a thickness of the second base layer ranges from 1 μm to 100 μm, and preferably ranges from 1 μm to 10 μm.

In one embodiment, a thickness of the third base layer ranges from 1 μm to 100 μm, and preferably ranges from 1 μm to 10 μm.

The purpose of the present invention and solving the technical problems thereof can be further achieved by the following technical solutions.

A method of manufacturing a flexible substrate includes: dissolving a flexible substrate in a solvent of N-methylpyrrolidone, wherein the flexible substrate comprises a sulfur-containing diamine monomer and a dianhydride monomer, and the flexible substrate dissolved in the solvent has a solid content of 5-30%; and performing a high temperature polymerization to form a polyamide film under an inert atmosphere, wherein the inert atmosphere is nitrogen atmosphere, a curing temperature ranges from 200° C. to 400° C., and a molar ratio of the sulfur-containing diamine monomer and the dianhydride monomer is controlled to obtain the flexible substrate having different refractive indexes, and the flexible substrate includes a glass substrate, a first flexible base layer disposed on the glass substrate, a second flexible base layer disposed on the first flexible base layer, and a third flexible base layer disposed on the second flexible base layer.

In one embodiment, 2,5-bis(4-aminophenylthio)thiophene is used as a diamine, 4,4' bis(3,4 dicarboxyphenylthio)diphenyl sulfide dianhydride is used as a dianhydride, the diamine and the dianhydride are dissolved in a solvent of N-methylpyrrolidone, a molar ration of diamine and the dianhydride is 1:1, and a solid content of a solution comprising the diamine and the dianhydride is controlled by 15%, the solution is coated on a surface of the glass substrate, and a film is formed by polymerizing at 300° C. under a nitrogen atmosphere to obtain a first polyimide layer having a refractive index of 1.75.

In one embodiment, a molar ratio of the diamine and the dianhydride in the solvent of N-methylpyrrolidone is adjusted to decrease a molar ratio of 2,5-bis(4-aminophenylthio)thiophene, the flexible substrate having a refractive index less than 1.75 is obtained, and the molar ratio of the diamine and the dianhydride in the solvent of N-methylpyrrolidone is controlled between (0.5-1):1 to obtain a second polyimide layer, and a film is sequentially formed to obtain the flexible substrate having a refractive index gradient.

In another embodiment, a display panel includes a first flexible substrate, a metal cathode disposed on the first flexible substrate, a light emitting unit disposed on the metal cathode, an organic layer disposed on the light emitting unit and the metal cathode, a transparent electrode disposed on the organic layer, and a second flexible substrate disposed on the transparent electrode.

A flexible substrate is provided to reduce reflection, and introducing an atom or a group having a high molar ratio of molecular refraction to a molecular volume in a polymer, such as a hetero atom sulfur (S), a halogen atom, an aromatic ring, etc. can increase the refractive index of the polymer. A substrate having a refractive index gradient is obtained by controlling the ratio of sulfur (S) atomic nucleus aromatic rings in each layer of polyimide (PI) polymer, thereby reducing light reflection at the indium tin oxide (ITO) interface, increasing light extraction efficiency, and achieving reflection reduction effect by improving the manufacturing process of the flexible substrate.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

FIG. 4 is a flow chart of a method of manufacturing a flexible substrate according to one embodiment of the present invention.

DETAILED DESCRIPTION OF PREFERRED EMBODIMENTS

Figure 1:
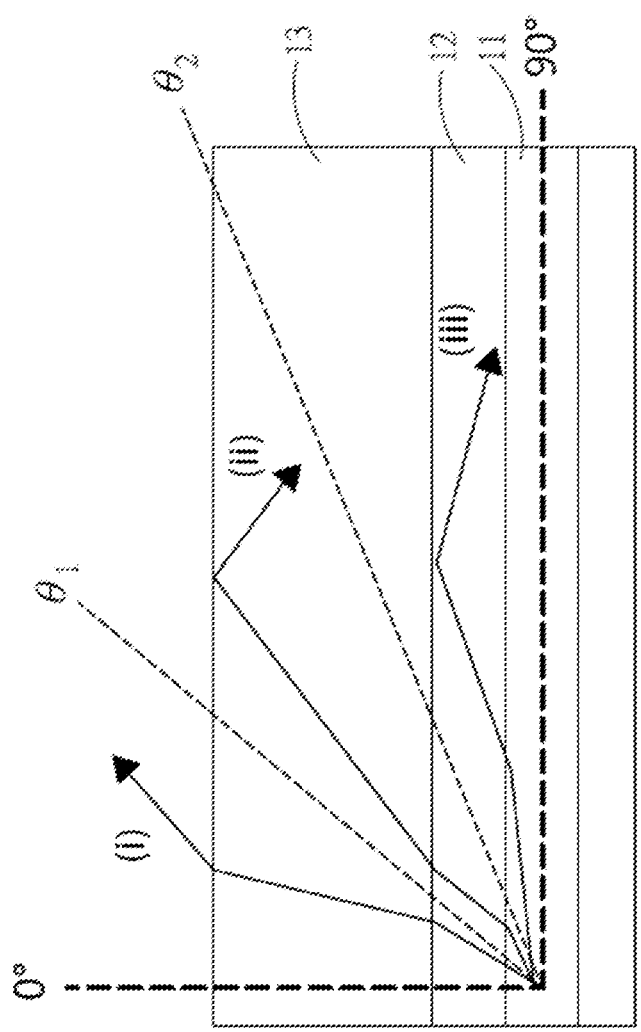
FIG. 1 is a schematic view of a flexible substrate in the prior art.

Please refer to the drawings, the same reference numerals represent the same components. The following description is based on the specific embodiments of the present invention as illustrated, and should not be construed as limiting the specific embodiments that are not described herein.

Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof.

In the drawings, the thickness of layers, films, panels, regions, etc. are exaggerated for clarity. In the drawings, the thickness of layers and regions are exaggerated for the purposes of illustration and description. It will be understood that when a component such as a layer, a film, a region, or a substrate is referred to as being "on" another component, the component can be directly on the other component or in an intermediate component.

The drawings and the description are to be regarded as illustrative rather than restrictive. In the drawings, elements having similar structures are denoted by the same reference numerals. In addition, the size and thickness of each component shown in the drawings are arbitrarily shown for the sake of understanding and convenience of description, but the present invention is not limited thereto.

In addition, in the specification, the term "include" is to be understood to comprise the component, but does not exclude any other component. Further, in the specification, "on" means located above or below the target component, and does not mean that it must be on the top based on the direction of gravity.

In order to further explain the technical means and efficacy for achieving the intended purpose of the present invention, a flexible substrate, a manufacturing method thereof, and a display panel according to the present invention are specifically implemented below with reference to the accompanying drawings and specific embodiments. The method, structure, characteristics, and efficacy are described in detail as follows.

Figure 2:
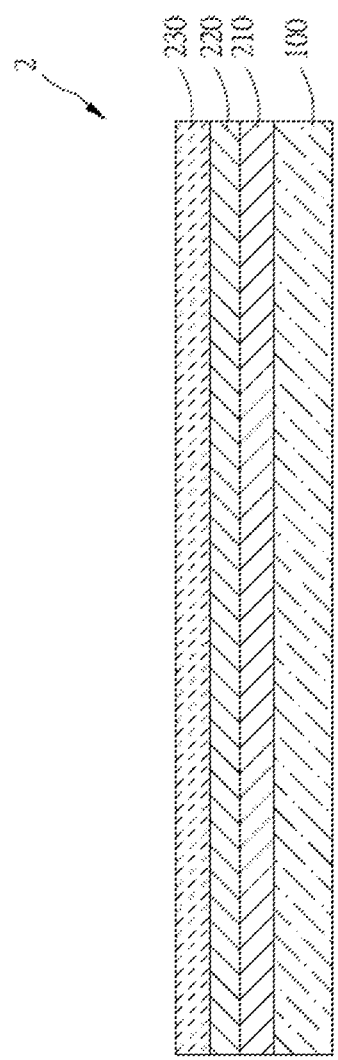
FIG. 2 is a schematic view of a flexible substrate according to one embodiment of the present invention.

FIG. 2 is a schematic view of a flexible substrate according to one embodiment of the present invention. Referring to FIG. 2, a flexible substrate 2 includes a glass substrate 100, a first flexible base layer 210 disposed on the glass substrate 100, a second flexible base layer 220 disposed on the first flexible base layer 210; and a third flexible base layer 230 disposed on the second flexible base layer 220.

In one embodiment, the first flexible base layer 210 is a first polyimide layer, the second flexible base layer 220 is a second polyimide layer, and the third flexible base layer 230 is a third polyimide layer.

In one embodiment, the first flexible base layer 210 has a refractive index greater than 1.52.

In one embodiment, a thickness of the first flexible base layer 210 ranges from 1 μm to 100 μm, and preferably ranges from 1 μm to 10 μm.

In one embodiment, a thickness of the second base layer 220 ranges from 1 μm to 100 μm, and preferably ranges from 1 μm to 10 μm.

In one embodiment, a thickness of the third base layer 230 ranges from 1 μm to 100 μm, and preferably ranges from 1 μm to 10 μm.

Figure 3:
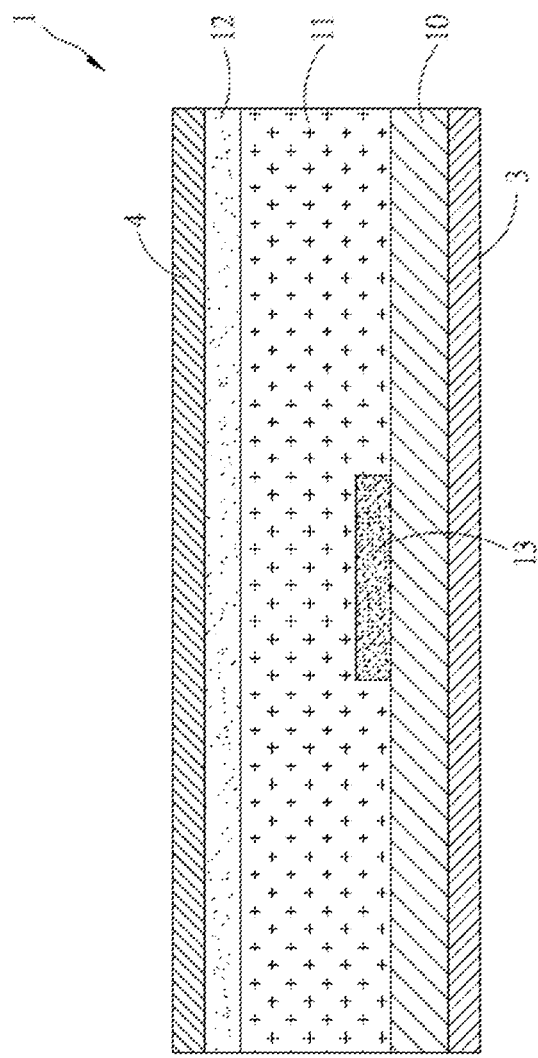
FIG. 3 is a schematic view of a display panel according to one embodiment of the present invention.

FIG. 3 is a schematic view of a display panel according to one embodiment of the present invention. Referring to FIG. 3, a display panel 1 includes a first flexible substrate 3, a metal cathode 10 disposed on the first flexible substrate 3, a light emitting unit 13 disposed on the metal cathode 10, an organic layer 11 disposed on the light emitting unit 13 and the metal cathode 10, a transparent electrode 12 disposed on the organic layer 11, and a second flexible substrate 4 disposed on the transparent electrode 12.

FIG. 4 is a flow chart of a method of manufacturing a flexible substrate according to one embodiment of the present invention. Referring to FIG. 2 and FIG. 4, a method of manufacturing a flexible substrate 2 includes:

dissolving the flexible substrate 2 in a solvent of N-methylpyrrolidone, and the flexible substrate includes a sulfur-containing diamine monomer and a dianhydride monomer, and the flexible substrate dissolved in the solvent has a solid content of 5-30%; and performing a high temperature polymerization to form a polyamide film under an inert atmosphere, wherein the inert atmosphere is nitrogen atmosphere, a curing temperature ranges from 200° C. to 400° C., and a molar ratio of the sulfur-containing diamine monomer and the dianhydride monomer is controlled to obtain the flexible substrate having different refractive indexes. The flexible substrate 2 includes a glass substrate 100, a first flexible base layer 210 disposed on the glass substrate 100, a second flexible base layer 220 disposed on the first flexible base layer 210, and a third flexible base layer 230 disposed on the second flexible base layer 220.

Referring to FIG. 2 and FIG. 4, 2,5-bis(4-aminophenylthio)thiophene is used as a diamine, 4,4' bis(3,4 dicarboxyphenylthio)diphenyl sulfide dianhydride is used as a dianhydride, the diamine and the dianhydride are dissolved in a solvent of N-methylpyrrolidone, a molar ration of diamine and the dianhydride is 1:1, and a solid content of a solution including the diamine and the dianhydride is controlled by 15%, the solution is coated on a surface of the glass substrate, and a film is formed by polymerizing at 300° C. under a nitrogen atmosphere to obtain a first polyimide layer 210 having a refractive index of 1.75.

Referring to FIG. 2 and FIG. 4, a molar ratio of the diamine and the dianhydride in the solvent of N-methylpyrrolidone is adjusted to decrease a molar ratio of 2,5-bis(4-aminophenylthio)thiophene, the flexible substrate having a refractive index less than 1.75 is obtained, and the molar ratio of the diamine and the dianhydride in the solvent of N-methylpyrrolidone is controlled between (0.5-1):1 to obtain a second polyimide layer 220, and a film is sequentially formed to obtain the flexible substrate 2 having a refractive index gradient.

Referring to FIG. 4, in the step S410, 2,5-bis(4-aminophenylthio)thiophene is used as a diamine, 4,4' bis(3,4 dicarboxyphenylthio)diphenyl sulfide dianhydride is used as a dianhydride, the diamine and the dianhydride are dissolved in a solvent of N-methylpyrrolidone, a molar ration of diamine and the dianhydride is 1:1, and a solid content of a solution including the diamine and the dianhydride is controlled by 15%, the solution is coated on a surface of the glass substrate, and a film is formed by polymerizing at 300° C. under a nitrogen atmosphere to obtain a first polyimide layer having a refractive index of 1.75.

Referring to FIG. 4, in the step S420, a molar ratio of the diamine and the dianhydride in the solvent of N-methylpyrrolidone is adjusted to decrease a molar ratio of 2,5-bis(4-aminophenylthio)thiophene, the flexible substrate having a refractive index less than 1.75 is obtained, and the molar ratio of the diamine and the dianhydride in the solvent of N-methylpyrrolidone is controlled between (0.5-1):1 to obtain a second polyimide layer.

Referring to FIG. 4, a film is sequentially formed to obtain the flexible substrate having a refractive index gradient.

A flexible substrate is provided to reduce reflection, and introducing an atom or a group having a high molar ratio of molecular refraction to a molecular volume in a polymer, such as a hetero atom sulfur (S), a halogen atom, an aromatic ring, etc. can increase the refractive index of the polymer. A substrate having a refractive index gradient is obtained by controlling the ratio of sulfur (S) atomic nucleus aromatic rings in each layer of polyimide (PI) polymer, thereby reducing light reflection at the indium tin oxide (ITO) interface, increasing light extraction efficiency, and achieving reflection reduction effect by improving the manufacturing process of the flexible substrate.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

The subject matter of the present invention can be manufactured and used in the industry, and also has an industrial applicability.

What is claimed is:

1. A method of manufacturing a flexible substrate, comprising:

dissolving a flexible substrate in a solvent of N-methylpyrrolidone, wherein the flexible substrate comprises a sulfur-containing diamine monomer and a dianhydride monomer, and the flexible substrate dissolved in the solvent has a solid content of 5-30%; and performing a high temperature polymerization to form a polyamide film under an inert atmosphere, wherein the inert atmosphere is nitrogen atmosphere, a curing temperature ranges from 200° C. to 400° C., and a molar ratio of the sulfur-containing diamine monomer and the dianhydride monomer is controlled to obtain the flexible substrate having different refractive indexes;

wherein the flexible substrate comprises a glass substrate, a first flexible base layer disposed on the glass substrate, a second flexible base layer disposed on the first flexible base layer, and a third flexible base layer disposed on the second flexible base layer.

2. The method of manufacturing the flexible substrate according to claim 1, wherein 2,5-bis(4-aminophenylthio) thiophene is used as a diamine, 4,4' bis(3,4 dicarboxyphenylthio) diphenyl sulfide dianhydride is used as a dianhydride, the diamine and the dianhydride are dissolved in a solvent of N-methylpyrrolidone, a molar ration of diamine and the dianhydride is 1:1, and a solid content of a solution comprising the diamine and the dianhydride is controlled by 15%, the solution is coated on a surface of the glass substrate, and a film is formed by polymerizing at 300° C. under a nitrogen atmosphere to obtain a first polyimide layer having a refractive index of 1.75.

3. The method of manufacturing the flexible substrate according to claim 1, wherein a molar ratio of the diamine and the dianhydride in the solvent of N-methylpyrrolidone is adjusted to decrease a molar ratio of 2,5-bis(4-aminophenylthio)thiophene, the flexible substrate having a refractive index less than 1.75 is obtained; and wherein the molar ratio of the diamine and the dianhydride in the solvent of N-methylpyrrolidone is controlled between (0.5-1):1 to obtain a second polyimide layer, and a film is sequentially formed to obtain the flexible substrate having a refractive index gradient.

\* \* \* \* \*